United States Patent [19]

Gorfinkel et al.

[11] Patent Number: 5,422,904
[45] Date of Patent: Jun. 6, 1995

[54] METHOD OF AND MEANS FOR CONTROLLING THE ELECTROMAGNETIC OUTPUT POWER OF ELECTRO-OPTIC SEMICONDUCTOR DEVICES

[75] Inventors: Vera B. Gorfinkel, Bau-Altenritte, Germany; Serge A. Gurevich, St. Petersburg, Russian Federation

[73] Assignee: Biota Corp., Locust Valley, N.Y.

[21] Appl. No.: 110,141

[22] Filed: Aug. 20, 1993

Related U.S. Application Data

[63] Continuation-in-part of Ser. No. 19,713, Feb. 19, 1993, Pat. No. 5,321,253, which is a continuation-in-part of Ser. No. 815,174, Dec. 31, 1991, Pat. No. 5,274,225.

[51] Int. Cl.$^6$ ................................................ H01S 3/19
[52] U.S. Cl. ........................................ 372/50; 372/31; 372/46
[58] Field of Search ........................ 372/46, 50, 25, 26, 372/29, 31

[56] References Cited

U.S. PATENT DOCUMENTS 5,241,554  8/1993  Iga et al. ............................ 372/46

*Primary Examiner*—James W. Davie

[57] ABSTRACT

The present invention relates to a separate confinement heterostructure laser, and in particular to a stripe geometry, ridge waveguide geometry, having an active layer positioned between a pair of n-type and p-type emitter layers which inject charge carriers under the ridge guide into the active layer. A pair of ohmic contacts are used to inject one type of charge carrier into at least one emitter layer outside the ridge area. When a signal is applied to the pumping contacts (p- and n-type) in forward bias and an intermittent electric field is applied to the ohmic side contacts, the flow of current injected by the side contacts controls the densities of carriers injected by the pumping contacts, thereby controlling spatially and temporally the optical gain and optical confinement factor. In another embodiment, a stripe geometry, ridge waveguide heterostructure laser is disclosed having pumping contacts under the ridge guide to an active layer between two emitter layers with a portion coextending transversely through the ridge and another portion extending laterally outside the ridge. A pair of electro-optic dielectric layers are positioned on the portion of one emitter layer extending outside the ridge. An electric field is applied to the emitter layers under the ridge contact to inject two types of charge carriers into the active layer, and an intermittent electric field is applied across the dielectric layer outside the ridge guide to modulate the refractive index, thereby controlling the optical mode shape. By synchronously applying signals to the pumping contacts and to the side contacts, modulation above 50 MHz can be attained and picosecond pulses can be generated in the devices of both embodiments, thereby reducing chirp and relaxation oscillations.

29 Claims, 4 Drawing Sheets

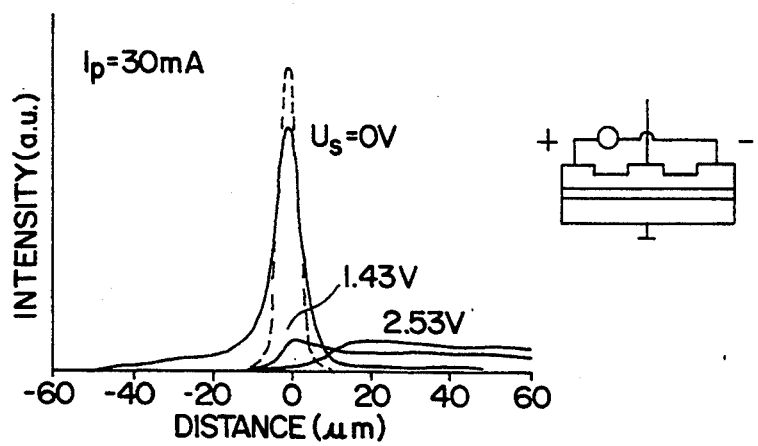
F I G. 3a
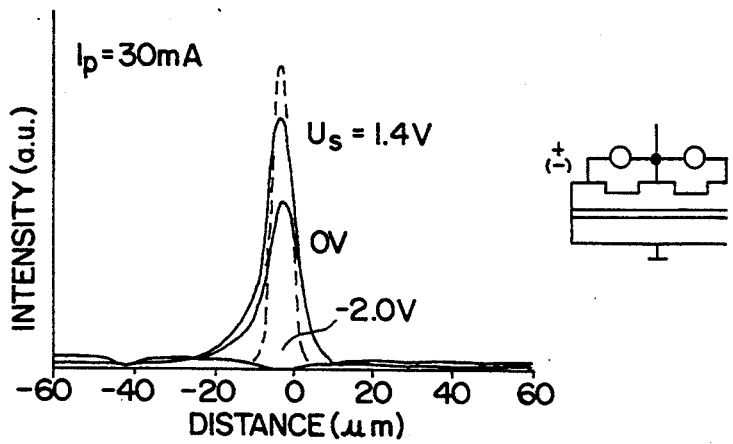
F I G. 3b
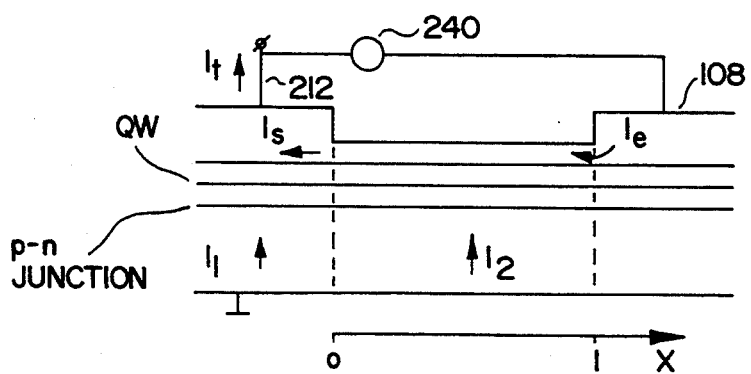
F I G. 4a
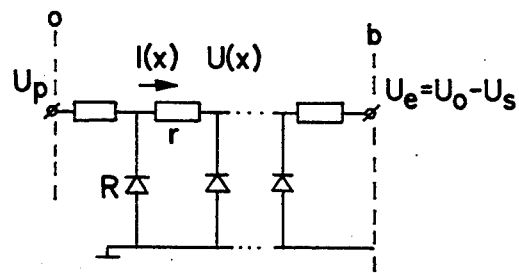
F I G. 4b

METHOD OF AND MEANS FOR CONTROLLING THE ELECTROMAGNETIC OUTPUT POWER OF ELECTRO-OPTIC SEMICONDUCTOR DEVICES

This is a continuation-in-part of application Ser. No. 08/019,713, filed Feb. 19, 1993, now U.S. Pat. No. 5,321,253, which is a continuation-in-part of application Ser. No. 07/815,174, filed Dec. 31, 1991, now patent No. 5,274,225.

BACKGROUND OF THE INVENTION

1. Field of the Invention

This invention relates to high frequency, high bit-rate, optoelectric (photonic) heterojunction devices and more particularly to methods of and means for controlling synchronously the optical confinement factor and number density of mobile charge carriers in a separate confinement heterostructure laser in order to control the electromagnetic output power and pulse waveform.

2. Description of the Prior Art

Optoelectronic semiconductor devices that emit electronic radiation are used extensively today for applications such as, for example, fiber-optic telecommunications and laser printers. These devices detect and modulate optical signals generated by an external radiation-emitting oscillator, while others convert optical electronic radiation into electrical energy. The theory and operation of these devices are well understood in the art, as was discussed in the book "Physics of Semiconductor Lasers" by S. M. Sze, Chapter 12, p. 736, published by John Wiley & Sons, New York, 1981.

Furthermore, as also described in the book by Sze, Chapter 12, Sec. 12.5.1, referenced above, heterostructures with low threshold current density have been designed by the use of:——carrier confinement provided by the energy barriers of higher bandgap semiconductor surrounding the active region, etc." More recently, small, efficient quantum well optoelectronic switching devices, such as the optical modulators and switches that were described in the article entitled "Quantum Well Optoelectronic Switching Devices" by D. A. B. Miller, Int. J. of High Speed Electronics, Vol. 1, No. 1, pp 19–46, March 1990, are capable of logic themselves and have potential for integration, and in the article entitled "Advances in Optoelectronic Integration" by O. Wada, Int. J. of High Speed Electronics, Vol. 1, No. 1, pp 47–71, March 1990, which reviewed the latest advances in optoelectronic integration. Furthermore, in the article entitled "Analysis of Semiconductor Microcavity Lasers Using Rate Equations" by G. Bjork and Y. Yamamoto, IEEE J. of Quantum Electronics, Vol. 27, No. 11, pp 2386–2396, Nov. 1991, equations that might achieve microcavity lasers with higher modulation speeds than previous devices were theoretically considered.

Devices for optical power modulation, such as described above, can be divided into two groups: active and passive devices. Active devices radiate electromagnetic power simultaneously with modulation and passive devices only modulate the radiation that passes through them. In all these devices, high frequency and high pulse rate modulation of optical power is the problem of importance in optical communication and high data rate system.

However, it is well known in the art that at present the maximum effective modulation bandwidth is limited to about 10 GHz for semiconductor lasers and to about 1 GHz for light diodes (Sze referenced above). Consequently, to investigate the limits on bandwidth, V. B. Gorfinkel and I. I. Filatov, in the article entitled "Heating of an Electron Gas by an hf Electric Field in the Active Region of a Semiconductor Heterolaser", Sov. Phys. Semicond., Vol. 24, No. 4, April 1990, investigated theoretically the influence of the heating of electron gas by an electric field $E(t)$ in the heterostructure AlGaAs, GaAs, AlGaAs on the optical gain. We considered only the energy balance equation and the carrier density rate equations in order to determine theoretically the influence of electric field $E(t)=E_o+E_1 \sin(2\pi ft)$ on the optical gain. Indeed, our theoretical analysis indicated that (where f is the applied signal frequency and t is time) depending on the ratio of the variable and constant components of the heating field $E_1$ and $E_o$, the optical gain value may theoretically be modulated both at signal frequency f and at double frequency 2f up to f=! GHz But, this theoretical analysis (Gorfinkel & Filatov) above did not consider any actual lasing operation and did not take into account any rate equation for light. Thus, our initial theoretical analysis encouraged us to proceed further with a new analysis and, if promising, to investigate new methods that might overcome the bandwidth problems associated with the prior art.

Subsequently, as described in the article entitled "High Frequency modulation of Quantum Well Heterostructure Diode Lasers by Carrier Heating in Microwave Electric Field" by S. A. Gurevich et al, Joint Soviet-American Workshop on the Physics of Semiconductor Lasers, p. 67, May 20-Jun. 3, 1991, our more complete theoretical analysis that considered the laser equations among others revealed that the optical gain of a quantum well heterostructure can be modulated by a spatially controlled microwave electric field when the field is applied by semiconductor contacts to the active layer. Our results were particularly surprising because Takamlza et al in Proc. IEEE, Vol. 56, No. 1, p. 135, 1968, failed in their early attempts to modulate laser output by placing samples in a microwave waveguide. Thus our method, which includes controlling the period and spatial distribution of the electric field inside the active layer, appears to have overcome the problems of the prior art.

More recently, Gorfinkel and Luryl published in Applied Physics Letters, 60 (25) Jun. 22, 1992, pp 3141–3143, an article entitled "Rapid Modulation of Interband Optical Properties of Quantum Wells by Intersubband Absorption" in which we calculated theoretically that intersubband radiation can control the mobile electron temperature and modulate the optical properties of a semiconductor quantum well. Our calculations in this article of a modulator are based on the same concepts described in the parent application relating to modulating by heating of one mobile charge carrier, but substituting Intersubband radiation from a $CO_2$ laser for heating mobile electron charge carriers.

The entire specifications of the parent application Ser. No. 07/815,174, filed on Dec. 31, 1991, patent No. 5,274,225 and its continuation-in-part Ser. No. 08/019,713 filed on Feb. 19, 1993, patent No. 5,321,253, are particularly incorporated herein, including the Detailed Description of the Preferred Embodiments.

Furthermore, applicants request that the prior art patents cited by the Examiner during examination of the parent application, namely U.S. Pat. No. 5,119,393, which issued to Oka on Jun. 2, 1992, and U.S. Pat. No.

5,081,633, which issued to Danner on Jan. 14, 1992, be made references of record in the present continuation-in-part. Both patents described lasers that were constructed with a plurality of optical cavities and with a plurality of electrodes. Oka teaches the use of a p-n junction in a laser to pump both types of charge carriers with electrodes positioned longitudinally along the optical axis of the laser, and Danner teaches the use of an indirect bandgap active layer and a constant electric field to transform the indirect material to direct bandgap. Thus, neither Oka nor Danner can function in accordance with the present invention to generate short pulses of photonic radiation by the process and apparatus described herein.

In the present invention, structural elements similar to a ridge waveguide structure and stripe-geometry electrodes are provided for generating charge carriers. Ridge waveguide lasers were described by Gfeller and Webb in J. Applied Physics, vol. 68, pages 14–20, 1990 and buried stripe electrodes by L. J. Mawst et al in Electronic Letters, vol. 21, pages 903–905, 1985. We discovered that by combining a stripe-geometry electrode structure with novel field control electrodes in a laser, high modulation rates were unexpectedly generated. Such modulation rates were even higher than those obtained by mobile carrier heating as disclosed in our parent application Ser. No. 07/815,174, now patent No. 5,274,225, of which the present application is a continuation-in-part.

SUMMARY OF THE INVENTION

It is an object of the invention to extend frequency bandwidth of active and passive optoelectronic heterojunction semiconductor devices above 50 GHz.

Another object is to provide optoelectronic heterojunction devices with output pulses in the picosecond range.

Another object is to modulate and to heterodyne two signals at frequencies above 50 GHz.

More particularly, we found that the electromagnetic output of a separate confinement heterostructure laser is modulated and picosecond pulses are generated by controlling the optical confinement factor while synchronously controlling the number density of the injected mobile charge carriers.

In the preferred mode of the invention, a ridge waveguide structure having a stripe-geometry electrode with a longitudinal axis is provided for generating two types of mobile charge carriers, the densities of which are modulated by an applied pumping signal. Semiconducting contacts positioned laterally with respect to the axis of the stripe-geometry electrode to contact ohmically one type of charge carrier to modulate the confinement factor. Additionally, the refractive indices of two dielectric layers are modulated.

Definitions

1. Carrier confinement describes the localization of nonequilibrium carriers within a narrow-band material in a semiconductor heterostructure. Nonequilibrium carriers excited in the narrow-band material will remain confined within this material due to the potential barriers at the heterointerfaces. When excited in the wide-band material within a diffusion length from the heterointerface, nonequilibrium carriers are also captured in the narrow-band material and confined within it. Depending on the conduction and valence band offsets of a heterostructure and its doping, carrier confinement may take place either for one type of nonequilibrium carriers or for both electrons and holes.

2. Optical confinement describes the localization of the light wave within a core area of optical waveguide when the light wave is propagating along the waveguide axis. To provide an optical confinement the core area should have a refractive index higher than that of the surrounding cladding area.

3. Optical mode shape relates to an eigenmode of the optical waveguide, describing the spatial distribution of the mode field intensity in both the transverse and lateral directions, which are perpendicular to the waveguide axis.

4. Modal gain is the effective optical gain of the mode, propagating in the optical waveguide which comprises the gain areas.

5. Separate confinement heterostructure is a heterostructure in which the area where the nonequilibrium carriers are confined (gain area) do not coincide spatially with the core area of the optical waveguide where the light wave is confined.

6. Optical confinement factor relates to separate confinement heterostructures, describing the ratio of the optical mode shape integrated over the gain area to the mode shape integrated over the entire waveguide area. The optical confinement factor is a proportionality coefficient between the modal gain and the material gain in the gain area.

BRIEF DESCRIPTION OF THE DRAWINGS

FIG. 3a, b show the near-field patterns at different potentials at the side contacts ($U_s$) in the two embodiments illustrated by FIG. 2a, b when the laser is pumped below the threshold ($I_p$) (solid curves) or above the threshold (dashed curves).

FIG. 4a, b show (a) the alignment of currents in the laser structure and (b) the corresponding distributed circuit used in the analysis of lateral potential and current distributions.

DETAILED DESCRIPTION OF THE PREFERRED EMBODIMENTS

Figure 1:
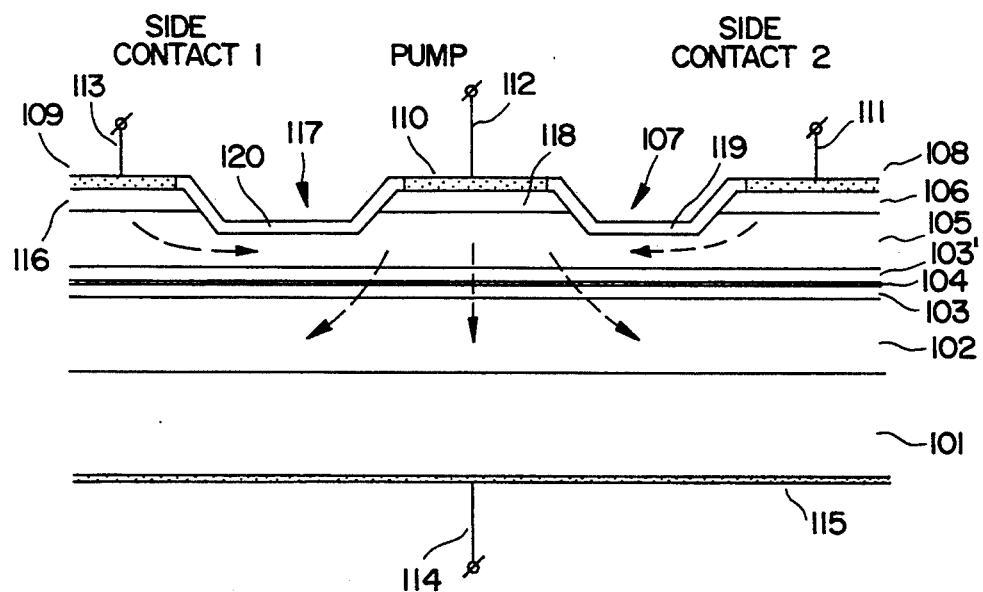
FIG. 1 is a cross sectional view of a heterostructure diode laser with semiconductor contacts for controlling the electric field in the emitter layer.

FIG. 1 shows a schematic cross section view of one embodiment of the invention. Here, the quantum well heterostructure diode laser includes a heavily doped substrate 101 of first conductivity type (p+ or n+), a semiconductor cladding layer 102 of the same conductivity type, an undoped narrow band active layer 104, which is a quantum well, sandwiched between two undoped intermediate band waveguiding layers 103 and 103'. The upper wide band cladding layer 105 of second conductivity type and the bottom cladding layer 102 of the first conductivity type both having refractive index lower than layers 103 and 103', provide transverse optical confinement of the laser mode. Also, layers 105 and 102 serve as emitters of electrons and holes to the active layer 104 through the layers 103' and 103. To pump the laser diode by injecting electrons and holes into the active layer 104, the forward bias is applied to the central metallic contact 110 through heavily doped layer 118 which makes an ohmic contact to the emitter layer 105. Additionally, forward bias is applied to the metallic contact 115, which makes ohmic contact to the emitter layer 102 through the substrate 101. Heavily doped contact layers 106 and 116 covered by metallic layers 108 and 109 provide ohmic contacts to layer 105 to laterally control the electric field Inside this layer, thereby controlling the lateral distribution of electron-hole plasma density and that of the optical gain in the active layer 104. Referring to FIG. 1, the side areas of the laser structure are separated from the central ridge area by two parallel grooves 107 and 117 covered by low refractive index dielectric layers 119 and 120. The bottom of the grooves is sufficiently close to the interface between layer 105 and waveguiding layer 103'. This narrowing in thickness of layer 105 provides lateral confinement of the laser mode.

Figures 2A, 2B:
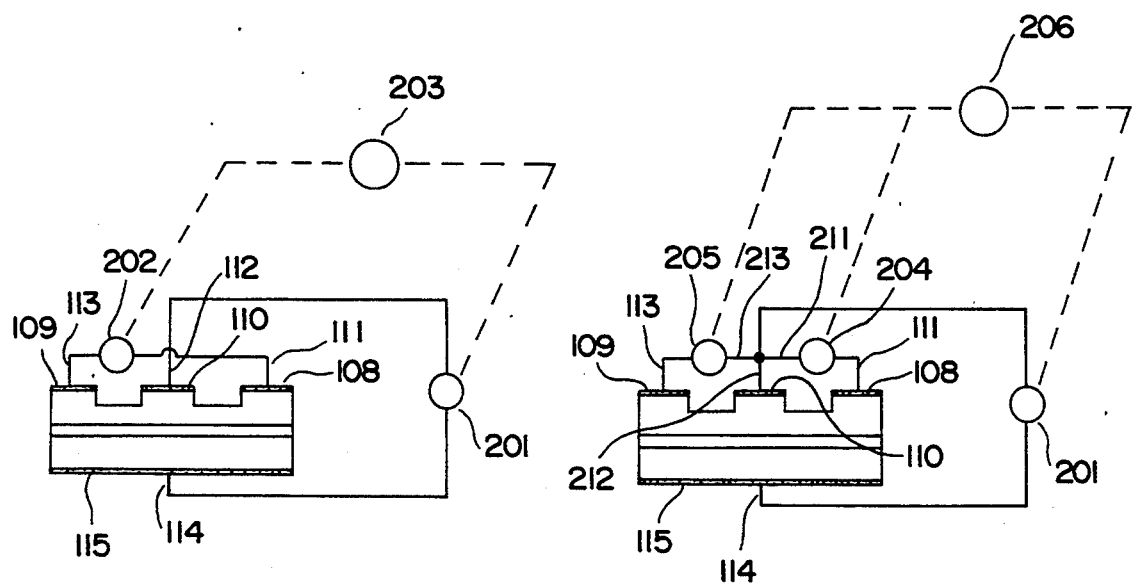
FIG. 2a, b are schematic drawings illustrating two embodiments of two circuits with a pumping current generator and signal generators for sychronous control between the electric field and pumping current in the laser diode of FIG. 1.

As illustrated schematically by FIG. 2a, a pumping current generator 201 is connected by leads 112 and 114, so that the signal of this generator is applied to terminals 110 and 115, thereby controlling temporally the amplitude of laser pumping current. Also, a signal generator 202 is connected through leads 111 and 113 to side contact terminals 108 and 109 to control temporally and spatially the electric field, lateral current flow and potential distribution in the layer 105, thus governing the lateral distribution of nonequilibrium carrier concentration injected into the active layer 104. The generators 201 and 202 are synchronized by phase controller 203. Alternatively, as shown in FIG. 2b, two signal generators 204 and 205 are used to drive independently the potentials at the side contact terminals 108 and 109 with respect to central electrode 110. Specifically, the first signal generator 204 is connected by lead 111 and through lead 211 with contact terminals 108 and 110, respectively, while the second signal generator 205 is connected by lead 113 and through lead 213 with contact terminals 109 and 110. Generators 201, 204 and 205 are synchronized by phase controller 206.

The laser shown in FIG. 1 is fabricated in the following way. The multiple layers of laser structure are grown In succession on the substrate 101 by using, for example, MBE technique. The thickness of cladding layers 102 and 105 (within side and ridge areas) is about 1.0 μm. The thickness of the quantum well active layer 104 is 100 Å, and the thickness of waveguide layers 103 and 103' is about 0.2 μm. As illustrated In FIG. 1, the ridge structure is formed by etching two parallel grooves 107 and 117, each of 5 μm width separated by 6 μm which is the width of the ridge area. The depth of the grooves is about 0.2 μm less than the distance from the top surface to interface between layers 103' and 105. The surfaces of the grooves 107 and 117 are then covered by transparent dielectric material films 119, 120 using conventional deposition techniques. Metallic layers 108, 109, 110, as well as 115 are deposited by thermal evaporation. Finally, the structure is cleaved or etched to form two crystal surfaces (not shown) parallel to each other and perpendicular to the ridge stripe and the optical axis. The distance between this cleaved or etched mirrors is the length of laser cavity.

For purpose of definition, we consider in the following description an AlGaAs/GaAs heterostructure laser, in which the narrow band active layer 104 is GaAs, the wide band layers 102 and 105' are $Al_xGa_{1-x}As$ solid solution, layers 103, 103' are $Al_yGa_{1-y}As$ (y<x), and the layers 106, 116, 118 are GaAs. The first conductivity type is p-type, while the second conductivity type is n-type.

In general terms, the laser shown in FIG. 1 operates as follows. The pumping current generator 201 (FIG. 2a,b) when connected to contact terminals 110 and 115 provides the forward bias of the laser diode, initiating the pumping of current flow and the injection of nonequilibrium carriers (electrons and holes) into the active layer 104. The optical axis of the laser beam is located on the plane of active layer 104 and is illustrated in the schematic drawing in FIG. 1 as being perpendicular to the cross sectional plane. Due to the potential barriers of the heterojunctions formed between the active layer 104 and the waveguiding layers 103 and 103', the injected carriers are confined in the transverse direction of the active layer 104 with respect to the optical axis 199. In the lateral direction with respect to the optical axis 199, i.e. parallel to the plane of active layer 104, the carrier concentration distribution is determined by the flow of pumping current as it spreads in the top emitter layer 105. The recombination of nonequilibrium carriers give rise to optical gain. When the pumping current exceeds threshold and lasing is achieved, the generated optical mode is confined transversely within waveguiding layers 103, 103', while in the lateral direction optical mode confinement is provided by the lower effective refractive index in the side waveguiding areas under the grooves 107 and 117. Thus, in the separate confinement heterostructure laser of FIG. 1, the effective gain for a mode is determined by the optical confinement factor, which is the overlap of the material optical gain profile and the optical mode shape in both transverse and lateral direction. The signal generator 202 (FIG. 2a) or signal generators 204 and 205 (FIG. 2b), connected between side contacts 108 and 109 or between central electrode 110 and side terminals 108, 109, provide the electric field and lateral current flow in the top emitter layer 105. This current flow results in a potential redistribution of the laser structure. The potential redistribution leads to pumping current redistribution and to corresponding profile variations of the carrier concentration and material gain in the lateral direction. Consequently, the optical confinement factor is controlled by the side contact potentials, which concomitantly control the laser output power. More details of laser operation are considered below in connection with FIGS. 3–6.

First, we consider FIG. 3a,b, which represents the plots of output radiation intensity measured at the laser mirror (near field intensity) vs. the lateral distance with the origin at the center of the ridge area. The solid curves in FIG. 3a,b are obtained when the laser is pumped with a pumping current of 30 mA, which is below its threshold value. Under this condition the near field patterns display the lateral distribution of nonequilibrium carrier concentration in the laser active layer. Then, solid curves in FIG. 3a manifest the transformation of carrier concentration distribution obtained when the potential difference $U_s$ equal to 0, 1.43, and 2.53V is applied between the side contact terminals 108, 109 synchronously with pumping. FIG. 3b illustrates the effect of variations in carrier concentration under the application of potential difference $U_s$ equal to 0, 1.4, and 2.0V between the side contact terminals 108, 109 and the central contact terminal 110. (see FIG. 2b). The pumping current and side contact potentials are applied in 100 ns pulses with 40 kHz repetition rate. In both connection modes depicted in FIGS. 2a and 2b we found that the amplitude of pumping and thus the overall injected carrier concentration are not affected by the side contact potentials. Thus, the observed effect of carrier concentration redistribution is explained by lateral redistribution of pumping current density.

More specifically, with no additional potential applied to the side contacts ($U_s = 0$), the ridge-structure laser diode Is non-uniformly biased by pumping current generator 201 through the central electrode 110. Actually, due to the lateral spread of pumping current inside the laser 105, forward bias of the p-n junction has its maximum in the center of the structure and the corresponding carrier concentration distribution is maximum in the ridge area, which is 6 μm wide. Then, when the signal generator 202 (or signal generators 204, 205) supplies the negative potential to a side contact, an additional forward bias is produced under this contact if the laser structure is on a p substrate. With overall pumping maintained constant, this results in pumping current redistribution and strong suppression of carrier concentration peak in the center of the ridge area. This effect is illustrated in FIG. 3a,b. In contrast, application of a positive potential pulse produces (in the case of p+ substrate) an additional reverse bias, which blocks the pumping current flow within the corresponding side area. If both side contacts block the pumping current flow outside of the ridge (see $U_s = 1.4V$ curve in FIG 3b) the carrier concentration is enhanced in the center of the structure.

To further clarify the mechanism of pumping current redistribution, FIG. 4a illustrates the flow of currents in the laser structure. Considered here is the connection mode, shown in FIG. 2b, with a blocking (positive) potential difference applied between the side contact terminal 108 and central electrode 110 by the signal generator 204. As seen from FIG. 4a, the total current $I_t$ in the lead 212 is the sum of the pumping current $I_1$, which flows through the p-n junction in the central ridge area, and of the side current $I_s$, which is a current spread in emitter layer 105 with the origin, X=0 at the edge of the ridge area:

$$I_t = I_1 + I_s \tag{1}$$

Here, the current $I_s$ is the sum of the pumping current $I_2$ which flows through the p-n junction in the "area under the groove" (0 < X < 1) and of the end current $I_e$, which crosses laterally the boundary X=1 and is flowing within the layer 105:

$$I_s = I_2 + I_e \tag{2}$$

The pumping current $I_2$ is an integral of pumping current density $J_2(X)$ taken over the groove area:

$$I_2 = \int_0^1 J_2(X) dX. \tag{3}$$

Finally, since the pumping current generator 201 has large internal resistance and signal generator 205 has low internal resistance, the following condition is fulfilled:

$$I_t = I_1 + I_2 + I_e \tag{4}$$

where $I_1 + I_2 = I_p$ is the overall pumping current produced by generator 201. gNote that equation (4) can be formally deduced from (1) and (2) as well. An important statement underlying the above consideration is that the metal electrodes 108, 110 make ohmic contacts to the mobile charge carriers in the emitter layer 105, while the potential barriers of the heterojunctions block the lateral current flow in the waveguiding layers 103, 103' and in the active layer 104.

Next, FIG. 4b represents an equivalent distributed circuit of the laser structure, consisting of resistances and diodes. Here, I(X) is the lateral component of the current and U(X) is a bias potential at the distributed diodes as a function of the lateral coordinate X, r is a specific resistance of the laser 105 (under the groove), and R is a specific resistivity of p-n junction in the laser structure. The current I(X) and potential U(X) are found to obey the following differential equations:

$$\frac{dU(X)}{dX} = -I(X) \cdot r, \tag{5a}$$

$$\frac{dI(X)}{dX} = -\frac{U(X)}{R(U)}. \tag{5b}$$

The diode specific resistivity R(U) can be expressed as $R(U) = U/J_2(U)$, where $J_2(U)$ is pumping current density defined in the area 0 < X < 1. The $J_2(U)$ dependence is given by the current-voltage characteristic:

$$J_2(U) = J_0[\exp \beta(U - J_2 R_0) - 1]; \tag{6}$$

where $J_0$ is the saturation current density, $\beta$ is an ideality factor, and $R_0$ is an internal serious resistance of the diodes. Equations (5a) and (5b) have been solved numerically using (6) and boundary conditions (1)–(4). In addition, the boundary conditions for I(X) and U(X) functions are set as follows:

$$I(0) = I_s; \; I(1) = I_e,$$

$$U(0) = U_0; \; U(1) = U_0 - U_s \tag{7}$$

The results of the solution are shown In FIG. 5.

Figure 5A:
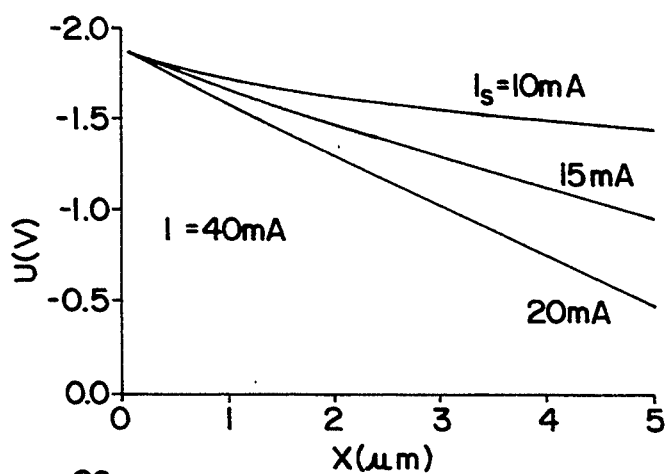
FIG. 5a, b show the calculated dependences of (a) the potential (U) and (b) the lateral current (I) as a function of the lateral distance with the origin located at the ridge edge.
Figure 5B:
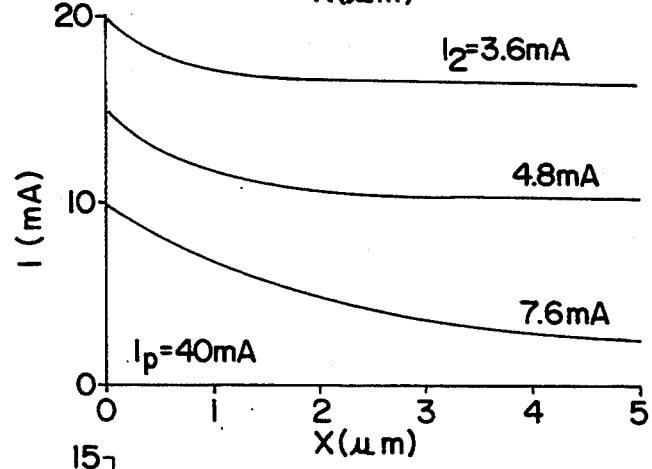

FIG. 5a, b show U(X) and I(X) plots calculated for 300 μm cavity length AlGaAs/GaAs ridge-structure laser diode grown on a p+ GaAs substrate, with the groove area length I=5 μm, the specific resistivity of n−$Al_xGa_{1-x}As$ upper emitter layer material $r = 10^{-2}$ ohm·cm$^{-1}$ and pumped by pumping current Ip=40 mA. In FIG. 5a, U(X) dependences are shown for positive (blocking) potential difference $U_s = 0.35$, 0.85, 1.35V between side (108) and central (110) electrodes, producing the side currents $I_s = 10, 15, 20$ mA, respectively. From FIG. 5a we found that the width of the area where the diodes are sufficiently forward biased to have the direct current the mA scale (this "forward biased" area is defined by the condition $U(X) < -1.6V$) is advantageously controlled by the potential at the side contact. The higher the potential difference $U_s$, the narrower the area through which the pumping current is allowed to flow. The corresponding I(X) dependences with the side current $I_s = 10, 15,$ and 20 mA are shown in FIG. 5b. These dependences manifest the drop within the "forward biased" area with the overfall equal to 7.6, 4.8 and 3.6 mA respectively. Since outside of the "forward biased" area I(X)=const, this overfall Is just equal to the pumping current 12 flowing in the side area. Thus, both the width of the "forward biased" side area and the fraction of pumping current flowing in this area are controlled by side contact potential. Resulting from the increase of $U_s$, the compression of "forward biased" area width and the decrease of 12 is compensated by slightly increased $U_0$ potential at the central electrode (FIG. 5a). So, the enhancement of side potential will result in redistribution of the pumping current into the central ridge area, which is also demonstrated by the near field patterns of FIG. 3b.

To describe the influence of side contact potentials and electric field induced in top emitter layer on the optical gain and the optical confinement factor, we note that the material optical gain g(X) in the laser active layer is proportional to the local carrier concentration n(X):

$$g(X) = g'[n(X) - n_0], \qquad (8)$$

where g' is the differential gain and $n_O$ is the transparency concentration. For the quantum well laser at threshold, $n(X) >> n_O$ if the laser cavity is not too long. Thus, in our case $g(X) \sim g' n(X)$, which means that the solid curves of FIG. 3 display not only the carrier concentration profiles n(X) but also the material gain profiles g(X). Then, turning again to FIG. 3, the dashed curves represent the near field patterns of the laser pumped above the threshold (the pumping current amplitude is 60 mA). In this case the near field patterns display the lateral intensity distribution in the lasing mode $I_m(X)$, which was found to be not affected by side contact potentials. This mode shape is determined by lateral refractive index distribution set by the ridge geometry (ridge width, grooves depth, etc). Further, the modal gain G is determined by the overlap of material gain profile g(X) with the lasing mode shape $I_m$:

$$G = \Gamma_t \frac{\int_{-\infty}^{\infty} g(X) I_m(X) dX}{\int_{-\infty}^{\infty} I_m(X) dX}, \qquad (9)$$

where $\Gamma_t$ is transerse optical confinement factor. Expression (9) can be written in the form:

$$G = \Gamma_t \Gamma_l \bar{g} \qquad (10)$$

where $\Gamma_l$ is lateral optical confinement factor and $\bar{g}$ is the average gain within the area occupied by the lasing mode. Finally, taking into account (9) and (10) we found that with constant mode shape $I_m(X)$ and gain profile g(X) controlled through both $\bar{g}$ and $\Gamma_l$ parameters. This is a key feature in the description of the invented laser operation.

Figure 6A:
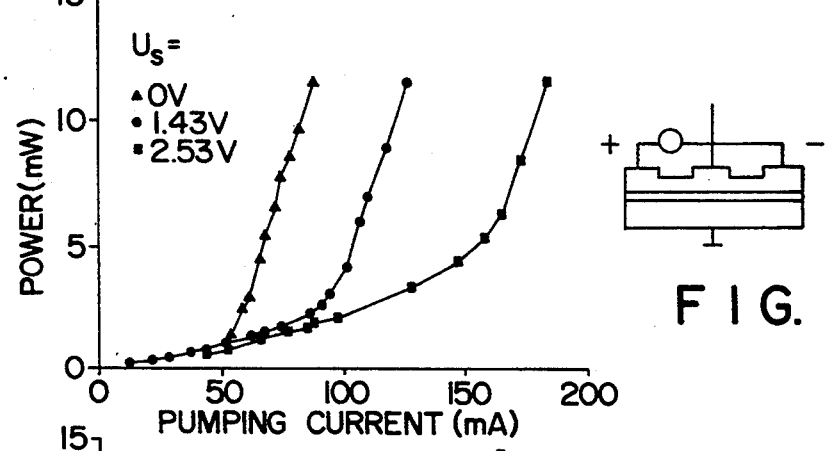
FIG. 6a, b show the laser output power vs. pumping current characteristics obtained at different potentials at the side contacts in the two embodiments illustrated by FIG. 20a, b.
Figure 6B:
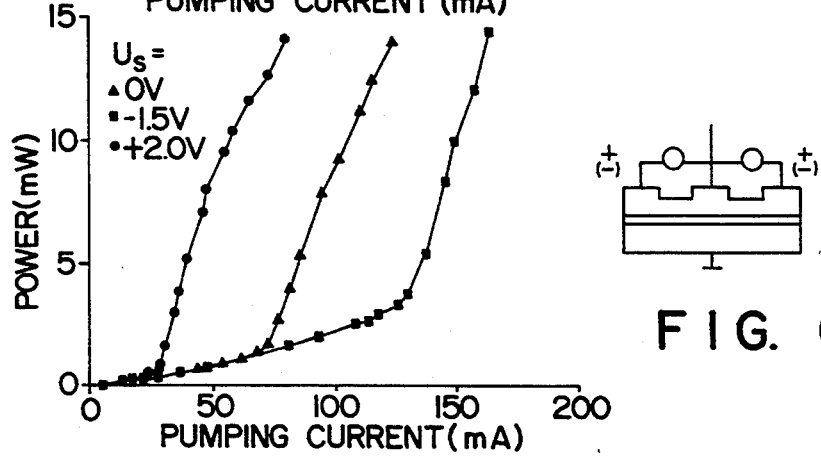

The effect of modal gain control is strictly illustrated by experimental laser output power vs pumping current (P-I) characteristics shown in FIG. 6a, b. These P-I characteristics are obtained when the laser pumping current and side contact potentials are synchronously controlled using two different device connection modes depicted in FIGS. 2a and 2b respectively. In the first case (FIG. 6a), the substantial increase in laser threshold is observed under the increase of potential difference between the side contacts, $U_s = 0, 1.43,$ and 2.53V. This behavior is consistent with carrier concentration and material gain suppression in the area occupied by the lasing mode, which is shown in FIG. 3a. In the second case (FIG. 6b), the threshold observed at $U_s = 0V$ can be either increased by negative (forward bias) side potential, $U_s = -1.5V$, or decreased by positive (blocking) side potential, $U_s = +2.0V$. This is also consistent with the observation of near field patterns transformation described by FIG. 3b. Thus, we found from FIG. 6a, b that the application of additional potential to the side contact terminals of the device shown in FIG. 1 is a mean to control effectively the laser output power.

Discussed above was the steady-state behavior of the laser. In order to describe the effect of electric field and side contact potentials on dynamic characteristics of the laser diode, we used a model based on laser rate equations:

$$\frac{dn}{dt} = \frac{J}{ed} - \frac{n}{\tau_s} - \frac{c}{N} g(n) S, \qquad (11)$$

$$\frac{dS}{dt} = \frac{c}{N} \Gamma g(N) S - \frac{S}{\tau_p} + \Gamma \frac{\beta n}{\tau_s}, \qquad (12)$$

where n and S are the carrier concentration and photon density, respectively, J is the pumping current density. The parameters $\tau_s$ and $\tau_p$ are spontaneous recombination and photon lifetime, respectively. As conventionally used, t is time, e is electron charge, c is the speed of light, N is the refractive index, d is the thickness of the active layer and $\beta$ is a fraction of spontaneous emission coupled into the lasing mode. In (12), $\Gamma = \Gamma_t \Gamma_l$ is the optical confinement factor, described by expression (10) and $\Gamma \cdot g(n) = G$ is a modal gain.

Following the small-signal approach to the equations (11), (12) we consider the small variations of the carrier concentration $\delta n$ and that of photon density $\delta S$. Then, $$n = n_0 + \delta n \qquad (13a)$$

$$S = S_0 + \delta S \qquad (13b)$$

where $n_O$ and $S_O$ are the steady-state carrier and photon densities, while $\Delta n << n_O$ and $\delta S << S_0$. According to the previous consideration of pumping current redistribution taking place under the application of side contact potentials, the driving force causing $\delta n$ and $\delta S$ variations is assumed to be the variation of the width of the area w in which the pumping current flows:

$$w = w_0 + \delta w \cos \omega t \qquad (14)$$

where $\delta w \ll w_0$, and $\omega$ is the modulation frequency. The pumping current is expressed as $I = J \cdot w \cdot L$, where J is the average pumping current density and L is the cavity length. At constant pumping $di = \delta J \cdot w \cdot L + J \cdot \delta w \cdot L = 0$, which gives $$\delta J = -\frac{J}{w} \delta w. \tag{15}$$

Then, using (9) and (10) the relation between $\delta w$ and optical confinement factor variation $\delta \tau$ is obtained as $$\frac{\delta \Gamma}{\Gamma} = \xi \frac{\delta w}{w}, \tag{16}$$

where $\epsilon = I_m(w)/\bar{I}_m(X)$, $I_m(w)$ is a mode field intensity at the side edge of the pumped area and $\bar{I}_m(X)$ is the average mode field intensity. The usual value of the parameter $\epsilon$ is about 0.1. Thus, we represent the pumping current density and optical confinement factor as $$J = J_0 + \delta J \tag{17a}$$

$$\tau = \tau_0 + \delta \tau \tag{17b}$$

where $J_0$ and $\tau_0$ are their steady-state components. Finally, to linearize the rate equations (11), (12) we expand the carrier concentration dependent gain $$g = g_0 + g' \delta n \tag{18}$$

where g' is a differential gain, $g' = dg/dn$.

After substitution of (13)–(18) into (11) and (12), we found the laser amplitude modulation response $|\delta S(\omega)|$ as $$|\delta S(\omega)| = \Gamma \xi \frac{g_0}{g'} \cdot \frac{\tau_p}{\tau_0} \cdot \frac{\delta w}{w} A_\Gamma(\omega). \tag{19}$$

The frequency dependent part $A_\Gamma(\omega)$ is given by $$A_\Gamma(\omega) = \frac{\omega_0^2 \, 1^* \omega^2 \tau_0^2}{(\omega_0^2 - \omega^2)^2 + \omega^2 \gamma^2}. \tag{20}$$

in (20), $\omega_0$ is the electron-photon resonance frequency, y is the damping factor, $\tau_0$ is given by $$\frac{1}{\tau_0} = \frac{\xi - 1}{\xi \tau_s} + \frac{c}{N} g' S. \tag{21}$$

Thus, $\tau_o$ as well as $\omega_0$ and $\gamma$ depend on the structure parameters and the output power.

An important feature of the $A_\Gamma(\omega)$ response is that in low frequency limit, expression (20) is equivalent to the well known direct modulation response. Actually, at low frequencies the influence of optical confinement factor variations on the modulation response $A_\tau(\omega)$ vanishes. Alternatively, In high frequency limit, the $\tau$-variation is a determining factor, while the pumping current density variation is relatively unimportant. When comparing $A_\tau(\omega)$ given by (20) with $A_T(\omega)$ response, obtained in the case of modulation by carrier heating (see parent application, formula (6) in (20) $\tau_0$ appears in the numerator Instead of $\tau_s$ in the parent case. Due to this, the $A_\tau(\omega)$ response is much more sensitive to the laser output power than $A_T(\omega)$ and the direct modulation responses, thus offering the possibility of having a very broad modulation bandwidth.

Figure 7:
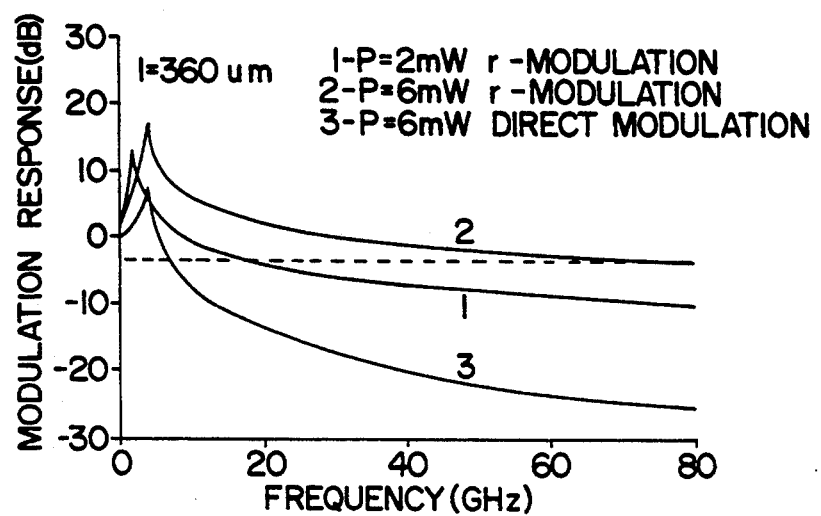
FIG. 7 is the calculated small-signal modulation responses of a 360 $\mu$m cavity length laser (the modulation modes and output power are indicated in the inset).

To illustrate this behavior, FIG. 7 shows the amplitude modulation responses calculated for a 360 μm cavity length AlGaAs/GaAs ridge-structure quantum well laser operating at room temperature at 2 mW and 6 mW output powers. In FIG. 7, curves 1 and 2 correspond to the considered modulation by the pumped area width variation governed by electric field in emitter layer ($\tau$-modulation). Curve 3 is a direct modulation response, for comparison. As shown in FIG. 7, all curves have a maxima in the frequency range 2–4 GHz, which corresponds to electron-photon resonance frequency. In contrast to direct modulation case when −3 dB modulation bandwidth is only about 7 GHz, the bandwidth for $\tau$-modulation is shown to depend strongly on output power, reaching 70 GHz at 6 mW output power !

Generally, the above analysis is valid up to the frequencies of about 100 GHz, which corresponds to the implementation limit of the rate equations (11), (12). In practical cases, the modulation response can be rolled off by parasitic RC parameters of the laser structure. More particularly, the parasitic RC associated with side contact areas of the laser may prevent the fast potential change and fast pumping current redistribution. Thus, the laser structure should be designed in an optimum way, Including the fabrication on semi-insulating substrate, minimization of side area size, and contact resistance in these areas.

Figure 9:
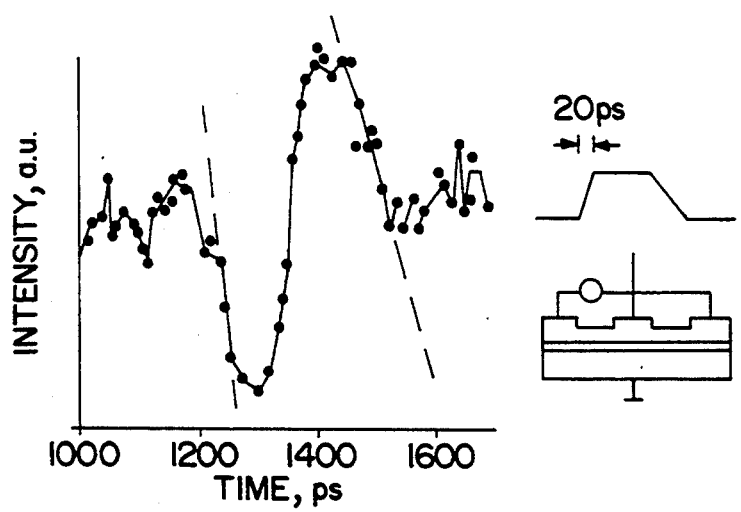
FIG. 9 is the streak-camera trace of the laser switching-off under the application of 20 ps rise-time 1.0V amplitude electrical pulse, applied to the side contacts of the laser shown in FIG. 1.

Under test, FIG. 9 shows the experimental output response on the application of short electrical pulse to the side contacts. In this experiment the laser was initially driven to 3 mW output power. Then, 100 ps electrical pulse with about 20 ps rise time was supplied to the laser side contacts. The amplitude of the pulse is about 1V. As a result, the observed output switching off time is about 20 ps, while after the modulating pulse the laser is involved in relaxation oscillations. On the other hand, the same laser sample directly modulated by pumping current at 3 mW output power demonstrates the radiation switching time of not less than 150–200 ps. This demonstrates the superiority of the laser modulation by the optical confinement factor control with respect to direct modulation.

Figure 8:
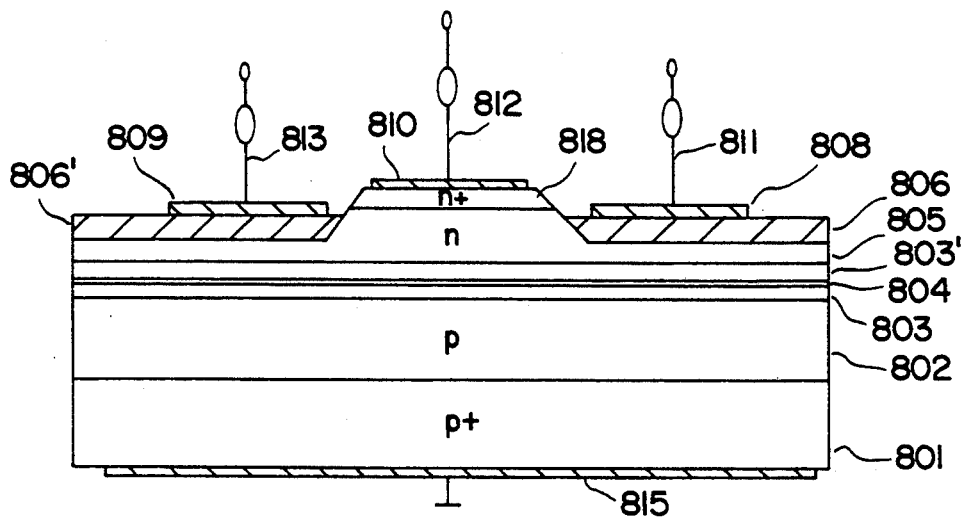
FIG. 8 shows a schematic cross sectional view of the laser with two side contacts for controlling the refractive index of the optical waveguide synchronously with pumping current.

FIG. 8 shows a schematic cross-section view of heterostructure diode laser with two side contacts for controlling the refractive index of the optical waveguide. In this laser, the semiconductor narrow band layer 804 is surrounded by higher bandgap waveguiding layers 803, 803'. As discussed above, layers 803, 803' are sandwiched between two lower index cladding layers 802 and 805, which have a bandgap higher than the bandgap of the layers 803, 803' and 804. Also, the cladding layer 802 of the first conductivity type and the cladding layer 805 of the second conductivity type serve as the emitters of nonequilibrium carriers into the active layer 104 through the layers 803 and 803'. Then the heavily doped substrate 801 of the first conductivity type covered by metallic layer 815 provides an ohmic contact to the emitter layer 802, while the heavily doped layer 818 of the second conductivity type covered by metallic layer 810 makes an ohmic contact to the upper emitter layer 805.

The ridge area, which is a narrow stripe aligned along the axis of the optical waveguide, is defined by lower thickness of the cladding layer 805 in the areas, which are laterally outside the ridge area. In these side areas, the surface of the layer 805 is covered by transparent dielectric layers 806, 806', made of electro-optical material. The refractive index of layers 806, 806' is lower than the refractive index of the layer 805. Metallic layers 808 and 809 are embedded on the surface of the layers 806 and 806', respectively, in order to induce the electric field inside the electro-optical material of layers 806, 806'.

Referring again to FIG. 8, the pumping current generator 8201, when connected with metallic layer 810 through the lead 812 provides the forward bias of the laser diode structure, thus controlling temporally the pumping current and concentration of nonequilibrium carriers injected into the active layer 804. The pumping current loop is completed through layers 802–805, contact layer 818, the substrate 801, metallic layer 815, and through the lead 814, which is a ground electrode. Then, signal generators 8204 and 8205 are connected through the leads 811 and 813 to metallic layers 808 and 809, respectively. Synchronously with pumping current, the signals of the signal generators 8204 and 8205 are applied to the layers 808, 809 inducing the electric field inside the layers 806 and 806', respectively, thus controlling the refractive indices of these layers. The electrical circuit in which, for example, the signal generator 8204 is included is then completed through the layers 801–805, through the metallic layer 815, and through the ground lead 814. Since the conductivity of semiconductor layers, metallic layers and leads is much higher than the conductivity of the dielectric layers 806, 806', the induced electric field is concentrated within these layers. The phase controller 8206 is used to synchronize the generators 8204, 8205 and the generator 8201.

In fabrication, the laser ridge structure is formed by etching of initial wafer surface in the side areas with subsequent deposition of the layers 806 and 806'. The metallic layers 801, 808, 809 and 815 are deposited by using, for example, the thermal evaporation technique. Finally, cleaved or etched laser mirrors perpendicular to waveguide axis are obtained by the usual methods. Different heterostructure materials, such as AlGaAs/GaAs, InGaAsP/InP etc., which are commonly employed for heterostructure diode laser fabrication can be used for the fabrication of the considered laser as well. As for the electro-optic material of the layers 806, 806', the amorphouses glasses doped by semiconductor nanocrystals can be used, for example. The advantage of this class of materials is that they are shown to exhibit an anomalously high electro-optic constant due to the size quantization of carriers in the nanocrystals. On the other hand, the fabrication technology of these materials was shown to be comparable with fabrication technology of diode lasers.

The laser shown in FIG. 8 operates as follows. At a certain pumping current the laser threshold is achieved. At still higher constant pumping, the lateral shape of the generated lasing mode is determined by the ridge area width, by the distance from the interface between layers 806, 805 to the interface between layers 806, 805 to the interface between layers 805, 803', as well as by the refractive index of both materials, 806 and 806'. Since the refractive indices of these electro-optic materials are independently controlled by the electric fields induced by the layers 806, 806', the potentials at side contact terminals 808 and 809 concomitantly control the lasing mode shape. Alternatively to the operation mode considered above in connection with FIG. 1, in the laser represented by FIG. 8 the pumping current spread in top emitter layer 805 and corresponding lateral gain profile are not affected by the side contact potentials, while the lasing mode shape is significantly affected. So the optical confinement factor is controlled by side contact potentials, thereby controlling the laser output power even at constant pumping current.

Obviously, in the laser shown in FIG. 8, the output power can be modulated by simultaneous pumping current variation and optical confinement factor control, thus opening the practical possibility for realizing the advantages of dual modulation technique described throughout the parent application Ser. No. 07/815,174, patent No. 5,353,295 and continuation-in-part Ser. No. 08/019,713, patent No. 5,321,253, the entire contents of which are incorporated herein. It is important that the modulation response of the laser shown in FIG. 8 can be very significantly faster than that of prior laser devices for a number of reasons. First, the reaction of the refractive index on the variation of electrical field inside the layers 806, 806' is as fast as about 1 ps, which is a well known characteristic for most electro-optic materials. Next, the size of the side area, covered by metallic layers 808 and 809, can be easily made small enough to have sufficiently small RC parasitics in the circuits of signal generators 8204 and 8205. Finally, as is shown by FIG. 7, the optical confinement factor variation is a mechanism capable of faster modulation of the laser output than previously available from any prior laser. Moreover, the considered laser structure is specially attractive since, if needed, the influence of electric field on the lasing mode shape can be greatly enhanced by choosing the parameters of the optical waveguide to be near the cutoff point; for example, the depth of wafer etching in the left hand side area and in the right hand side area should be different. Other structural elements and processes known to those skilled in the art may be combined with those disclosed herein and remain within the scope of the invention such as combinations of ridge waveguide lasers with multiple quantum wells and graded index cladding layers.

We claim:

1. A method of controlling the output electromagnetic power of a heterostructure diode laser comprising the steps of:

providing a high refractive index optical waveguide with an optical axis, optical gain and optical confinement factor comprising a narrow-band active layer positioned between and first wide-band, low refractive index emitter layer having a first conductivity type of mobile charge carriers and a second wide-band, low refractive index emitter layer having a second conductivity type of mobile charge carriers, a portion of said emitter layers and said active layer coextending through said optical waveguide and another portion extending laterally outside said optical waveguide;

applying a first electric field to at least the portion of the said first and second emitter layers and the said active layer coextending through said optical waveguide so as to inject a density of said first conductivity type and a density of said second conductivity type of said mobile charge carriers in said active layer;

applying a second intermittent electric field to the another portion of at least one of said emitter layers extending laterally outside said optical waveguide and having a potential distribution inside said emitter layer so as to inject a current flow of one type charge carrier having the same conductivity as said one emitter layer, said electric field controlling spatially the said current flow, the said potential distribution and the said densities of said first conductivity type and of said second conductivity type of said mobile charge carriers inside said active layer; and, controlling the intensity, period and phase of said first electric field applied to said active layer and the intensity, period and phase of said second electric field, said electric fields controlling the emission of pulses of electromagnetic radiation from said diode laser.

2. The method as set forth in claim 1 which comprises the further steps of forming a first semiconducting contact comprising a first doped semiconductor of the same conductivity type to said first emitter layer and a second semiconducting contact comprising a second doped semiconductor of the same conductivity type to said second emitter layer; and applying a first conductive pumping contact to a surface portion of said first semiconducting contact and a second conductive pumping contact to a surface portion of said second semiconducting contact.

3. The method as set forth in claim 2 comprising the further steps of applying a first signal from a first signal generator means to said first pumping contact and a second signal from a second signal generator means to said second pumping contact.

4. The method as set forth in claim 1 comprising the further step of forming a first and a second field control contacts comprising doped semiconductors of the same conductivity type to said at least one emitter layer to ohmically contact said at least one emitter layer so as to inject said one conductivity type of mobile charge carriers.

5. The method as set forth in claim 4 comprising the further step of applying a second signal from a second signal generator means to said first and second field control contacts so as to control said electric field applied to said at least one emitter layer.

6. The method as set forth in claim 5 in which said first signal having a first intensity, period and phase is applied to said first and second pumping contacts and said second signal having a second intensity, period and phase is connected to said first and second field control contacts with a second intensity, period and phase and said first and second signals are synchronously controlled to modulate said output electromagnetic power from said diode laser.

7. The method as set forth in claim 6 comprising the further step of synchronously controlling the intensity, period and phase of said first and said second signal to produce pulsed electromagnetic radiation.

8. The method as set forth in claim 2 comprising the further step of forming a quantum well layer having a major axis inside said optical waveguide with said major axis of the quantum well layer aligned longitudinally with said optical axis of said optical waveguide.

9. The method as set forth in claim 8 in which said quantum well layer is a multiple quantum well layer.

10. The method as set forth in claim 2 comprising the further step of forming said active layer and said optical wave guide as a stripe-geometry waveguide with the optical axis of said stripe-geometry waveguide and said active layer in alignment; and forming laser mirrors perpendicular to said optical axis on opposite edges of said waveguide and said active layer.

11. The method as set forth in claim 2 comprising the further steps of forming said first and second emitter layers, said first and second doped semiconductor layers, and said first and second pumping contacts as a ridge waveguide structure with an optical mode shape in which one of said pumping contacts has a stripe-geometry with a major axis longitudinally aligned with respect to said optical axis of said waveguide; and controlling said electric field so as to control said optical gain and optical confinement factor.

12. The method as set forth in claim 11 comprising the further step of applying said first and second field-control semiconducting contacts to said emitter layer with said first and second field-control semiconducting contacts being electrically isolated and being spaced apart laterally from said stripe-geometry pumping contact.

13. A method of controlling the output electromagnetic power of a heterostructure diode laser comprising the steps of:

providing a stripe-geometry optical waveguide having an optical axis and an optical mode shape, said optical waveguide comprising a high refractive index narrow-bandgap active layer positioned between a first wide-bandgap, low refractive index emitter layer having a first conductivity type of mobile charge carriers and a second wide-bandgap, low refractive index emitter layer having a second conductivity type of mobile charge carriers, a portion of said emitter layers and said active layer coextending through said optical waveguide and a portion extending outside said optical waveguide;

providing a dielectric layer of electro-optic material positioned on the surface of the portion of one of said emitter layers extending outside said optical waveguide;

applying a first electric field to at least the portion of said first and second emitter layers and said active layer coextending through said optical waveguide so as to inject a density of said first conductivity type and a second density of said second conductivity type of mobile charge carriers in said active layer;

applying a second electric field to said dielectric layer of electro-optic material so as to control said optical mode shape of said stripe-geometry optical waveguide; and, controlling the intensity, period, and phase of said first electric field and the intensity, period, and phase of said second electric field so as to control the emission of pulses of electromagnetic radiation from said diode laser.

14. The method as set forth in claim 13 comprising the further steps of forming a first semiconducting contact comprising a first doped semiconductor of the same conductivity type to said first emitter layer and a second semiconducting contact comprising a second doped semiconductor of the same conductivity type to said second emitter layer; and applying a first conductive pumping contact to said first semiconducting contact and a second conductive pumping contact to said second semiconducting contact so as to apply forward bias to said emitter layers.

15. The method as set forth in claim 14 comprising the further steps of applying a first signal to said first and second pumping contacts.

16. The method as set forth in claim 13 in which said dielectric layer comprises a pair of dielectric layers positioned on a first and a second portion of said portion of the said first and second emitter layers and the said active layer extending outside said optical waveguide extending transversely on opposite sides of said optical waveguide, comprising the further steps of forming a first and a second field-control contacts to said pair of dielectric layers so as to apply said electric field to said pair of dielectric layers.

17. The method as set forth in claim 16 comprising the further step of applying a second signal to said first and second field control contacts to control said electric field applied to said at least one of said dielectric layers.

18. The method as set forth in claim 17 comprising the further steps of applying said first signal having a first intensity, period and phase to said first and second pumping contacts; applying said second signal having a second intensity, period and phase to said first and second field control contacts with a second intensity, period and phase; and synchronously controlling said first and second signals to modulate said output electromagnetic power from said diode laser.

19. The method as set forth in claim 18 comprising the further step of sychronously controlling the intensity, period and phase of said first and said second signal to produce pulsed electromagnetic radiation.

20. The method as set forth in claim 14 comprising the further step of forming a quantum well layer having a major axis inside said optical waveguide with said major axis of said quantum well layer aligned longitudinally with said optical axis of said optical waveguide.

21. The method as set forth in claim 20 in which said quantum well layer is a multiple quantum well.

22. The method as set forth in claim 14 comprising the further step of maintaining said stripe-geometry optical waveguide close to its cutoff point.

23. The method as set forth in claim 13 comprising the further step of forming said dielectric layers of electro-optic material with glass layers doped with semiconductor microcrystals.

24. The method as set forth in claim 14 comprising the further step of forming laser mirrors on opposite edges of said stripe-geometry optical waveguide, said laser mirrors being perpendicular to said optical axis of said stripe-geometry optical waveguide.

25. The method as set forth in claim 14 comprising the further step of forming at least one of said pumping contacts as a stripe-geometry contact having a major axis aligned with said optical axis of said stripe-geometry waveguide to pump locally said active area.

26. The method as set forth in claim 25 comprising the further step of applying said first and second field-control semiconductor contacts to said first and second dielectric layers with said first and second field-control semiconductor contacts being electrically isolated and being spaced laterally apart from said stripe-geometry pumping contact.

27. The method set forth in claim 13 in which said laser has a confinement factor, said active layer has material optical gain, and said optical waveguide has a modal optical gain as determined by said material gain and by said optical confinement factor comprising the further steps of applying an electric field inside at least one of said dielectric layers to control said material optical gain inside said active layer to control said confinement factor.

28. The method set forth in claim 27 comprising' the further step of controlling said concentration and said optical confinement factor to control said modal gain.

29. A high frequency, high bit-rate heterostructure diode laser comprising in combination:
- a stripe-geometry optical waveguide comprising a narrow-band low refractive index active layer positioned between a first wide-band low refractive index emitter layer having a first conductivity type of mobile charge carriers and a second wide-band low refractive index emitter layer having a second conductivity type of mobile charge carriers, a portion of said emitter layers coextending through said optical waveguide and another portion extending outside said optical waveguide;
- pumping means for injecting said first conductivity type and said second conductivity type of said mobile charge carriers inside said active layer;
- field control means for applying an electric field to at least one of said emitter layers for injecting one type of charge carrier of the same polarity in said active layer;
- first signal means adapted to control the intensity and period of said first signal and for applying a first signal to said pumping means;
- second signal means adapted to control the intensity and period of said second signal and for applying a second signal to said means; and
- means for synchronously controlling the said intensities, periods and phase of said first signal means and said second signal means.

* * * * *